United States Patent [19]
Voldman

[11] Patent Number: 5,610,791
[45] Date of Patent: Mar. 11, 1997

[54] POWER SEQUENCE INDEPENDENT ELECTROSTATIC DISCHARGE PROTECTION CIRCUITS

[75] Inventor: Steven H. Voldman, Burlington, Vt.

[73] Assignee: International Business Machines Corporation, Armonk, N.Y.

[21] Appl. No.: 523,976

[22] Filed: Sep. 6, 1995

Related U.S. Application Data

[63] Continuation-in-part of Ser. No. 312,255, Sep. 26, 1994.

[51] Int. Cl.$^6$ ........................................ H02H 9/04
[52] U.S. Cl. ............................ 361/56; 361/111; 307/86
[58] Field of Search ........................... 361/56, 91, 111; 257/355; 307/85–86

[56] References Cited

U.S. PATENT DOCUMENTS

| | | | |
|---|---|---|---|
| 4,870,530 | 9/1989 | Hurst et al. | 361/91 |
| 5,140,401 | 8/1992 | Ker et al. | 357/43 |
| 5,196,981 | 3/1993 | Kuo | 361/56 |
| 5,239,440 | 8/1993 | Merrill | 361/91 |
| 5,287,241 | 2/1994 | Puar | 361/56 |
| 5,301,084 | 4/1994 | Miller | 361/91 |
| 5,343,352 | 8/1994 | Nagamine | 361/56 |
| 5,359,211 | 10/1994 | Croft | 257/173 |
| 5,528,447 | 6/1996 | McManus | 361/91 |

*Primary Examiner*—Jeffrey A. Gaffin
*Assistant Examiner*—Michael J. Sherry
*Attorney, Agent, or Firm*—Heslin & Rothenberg, P.C.

[57] ABSTRACT

In an IC chip having multiple power supply rails, ESD protection circuitry is provided. The ESD protection circuitry protects each power supply rail from an ESD impulse with respect to ground and with respect to the other power supply rails. The ESD protection circuitry is power sequence independent thereby eliminating any restrictions on the sequencing of power as applied to, and removed from, the different power supply rails of the IC chip. A discharge device is controlled by a biasing device such that ESD impulses are passed through the discharge device, but power supply current is not passed therethrough during power sequencing.

15 Claims, 7 Drawing Sheets

POWER SEQUENCE INDEPENDENT ELECTROSTATIC DISCHARGE PROTECTION CIRCUITS

This application is a continuation in part of application Ser. No. 08/312,255, filed on Sep. 26, 1994 entitled "ELECTROSTATIC DISCHARGE PROTECTION CIRCUITS FOR MIXED VOLTAGE INTERFACE AND MULTI-RAIL, DISCONNECTED POWER GRID APPLICATIONS," which is hereby incorporated by reference herein in its entirety.

TECHNICAL FIELD

This invention relates to semiconductor devices, and more particularly relates to circuits designed to protect such devices from damage due to undesirable voltage conditions which can cause catastrophic damage to circuit elements; these circuits are commonly referred to as electrostatic discharge ("ESD") protection circuits. More particularly, the present invention relates to power sequence independent on-chip ESD protection circuits for integrated circuit ("IC") chips with multiple power bus architectures.

BACKGROUND OF THE INVENTION

Today's computer architectures require the interfacing of semiconductor chips or sub-systems with different internal power-supply voltages. The semiconductor-chip power-supply voltages are different because of the technology generation mix, technology types, and applications. For example, dynamic random access memory ("DRAM") chips must communicate with other logic and microprocessor chips. Microprocessors must communicate with co-processors, analog circuits, printers and other input/output ("I/O") circuits. Each of these devices may have different power-supply supply voltages making power management and interfacing difficult.

Furthermore, IC chips themselves may have multiple internal power supply rails. A DRAM chip may operate internal circuitry based upon a first power supply rail, and may use interface circuitry based on a different power supply rail. An Application Specific Integrated Circuit ("ASIC") chip may require many different power supplies, each being for different internal circuitry and each being capable of independent operation. To save power, each of these internal circuits may be independently powered off and on based upon dynamically changing operational requirements. This power sequencing raises design issues.

ESD protection circuitry becomes problematic in IC chips with multiple, independently sequenced, power supply rails. Difficulties arise in designing both ESD protection circuitry disposed between each power supply rail and ground, and ESD protection circuitry disposed between the power supply rails. For instance, conventional power supply rail ESD protection circuits have "sequence dependence," which is defined herein to mean that there are functional restrictions on the sequence that power can be applied to, and removed from, the multiple power rails of an IC chip.

As one example, in an IC chip with a 2.5 v and a 3.3 v power supply rail, conventional ESD protection circuits may have required that upon power-on, the t3.3 v power supply rail be energized prior to the 2.5 v power supply rail being energized. As a further example, during power saving modes, certain power supply rails may be required to be deactivated before other power supply rails, in a predetermined sequence. If any of the above-discussed power sequencing is violated, current may flow from, e.g., an energized rail to a de-energized rail causing a short circuit and/or defeating the purpose of an energy saving mode. "Power sequence dependence" thereby restricts the number of operational power saving modes that can be engaged. Examples of conventional "power sequence dependent" inter-rail ESD protection circuits include double diode stacks (FIG. 1) and FETs having drain-to-gate connections (FIG. 2).

Therefore, a desired feature for ESD protection of power supply rails is that ESD protection circuits do not draw power supply current from a powered-up power supply rail when another power supply rail is powered-down, regardless of power sequencing. ESD protection circuits that satisfy this condition are defined herein as "power sequence independent" ESD protection circuits, to which the present invention is directed.

DISCLOSURE OF THE INVENTION

To summarize, the present invention includes a semiconductor structure for protection against ESD ("Electro-Static Discharge") impulse in a multiple power supply environment. The semiconductor structure includes a first power rail, a second power rail and an inter-rail ESD protection circuit. The inter-rail ESD protection circuit is connected between the first power rail and the second power rail, and is power sequence independent. Accordingly, the inter-rail ESD protection circuit prevents power supply current flow through it and between the first power rail and the second power rail, regardless of power sequencing of the first power rail and the second power rail.

As an enhancement, the inter-rail ESD protection circuit may include a first FET having a source, a drain, a gate and a well. The source is connected to the first power rail, the gate is connected to the second power rail, and the drain and the well are commonly connected to facilitate the inter-rail ESD protection circuit being power sequence independent. Further, the inter-rail ESD protection circuit may include a transistor having a well, a first current carrying terminal and a second current carrying terminal. The well of the transistor is connected to the commonly connected drain and well of the first FET, the first current carrying terminal of the transistor is connected to the first power rail and the second current carrying terminal is connected to the second power rail. The transistor facilitates discharging ESD impulse between the first power rail and the second power rail and facilitates the inter-rail ESD protection circuit being power sequence independent.

As a further enhancement, the semiconductor structure may include a ground and a power clamp ESD protection circuit between the first power rail and the ground plane. Specifically, the power clamp ESD protection circuit may include a controllable discharge circuit and an ESD sense circuit, both connected between the first power rail and the ground. The controllable discharge circuit has a control input connected to the ESD sense circuit. The ESD sense circuit facilitates activation of the controllable discharge circuit when an ESD impulse is detected on the first power rail and facilitates blocking activation of the controllable discharge circuit during power-up of the first power rail.

As yet another enhancement, the semiconductor structure of claim 5 may include a control connection between the inter-rail ESD protection circuit and each of the controllable discharge device and the ESD sense circuit of the power clamp ESD protection circuit for biasing thereof to enhance ESD dissipation of the power clamp ESD protection circuit. Further enhancements include another power clamp ESD protection circuit connected between the second power rail and the ground for protecting the second power rail from ESD impulses.

To summarize, the present invention has many advantages and features associated with it. Power sequence independent ESD impulse protection is provided between each power rail and ground and between the power rails themselves. The ESD protection circuitry is power sequence independent, thereby eliminating any operational limitations on the sequencing of power supplies for, e.g., power-up and power saving modes. Further, the techniques disclosed herein increase the performance of ESD impulse protection circuits. Higher voltage ESD impulses can therefore be safely discharged. Accordingly, the techniques disclosed herein advance the art of ESD protection of power rails on IC chips.

BRIEF DESCRIPTION OF THE DRAWINGS

The subject matter regarded as the present invention is particularly pointed out and distinctly claimed in the concluding portion of the specification. The invention, however, both as to organization and method of practice, together with further objects and advantages thereof, may best be understood by reference to the following detailed description taken in conjunction with the accompanying drawings in which:

DESCRIPTION OF THE PREFERRED EMBODIMENT

The preferred embodiment of the invention will be described in terms of a specific semiconductor processing environment which includes well known CMOS technology using ion implanted dopant regions including n-well regions in which p-channel devices are formed by conventional processing. Isolation is of the type referred to as, e.g., Shallow Trench or LOCOS Isolation which is well known in the literature.

The techniques of the present invention facilitate the suppression of Electro-Static Discharge ("ESD") in IC chips which use multiple power supply rails. ESD suppression is achieved between each power supply rail ("power rail") and a ground plane ("ground"), and between the power rails themselves. Moreover, the ESD suppression is "power sequence independent." The term "power sequence independent" is defined herein to mean that regardless of the sequence of activation and deactivation of the multiple power rails, the ESD protection circuitry will not sink power supply current to an unpowered rail from a powered rail. The circuitry disclosed herein includes devices through which ESD impulses are discharged; these devices are controlled (i.e., biased) by circuitry which ensures that they conduct during ESD impulses, but do not conduct during power sequencing. Thus, full ESD protection is facilitated without imposing operational restrictions on the sequencing of power supply rails (e.g., in connection with energy saving modes).

Figure 1:
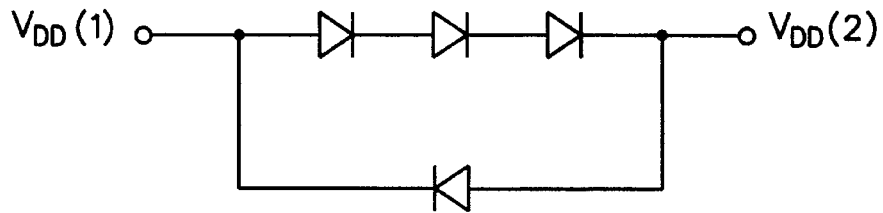
FIGS. 1–2 are schematic diagrams of conventional power sequence dependent inter-rail ESD protection circuits.
Figure 2:
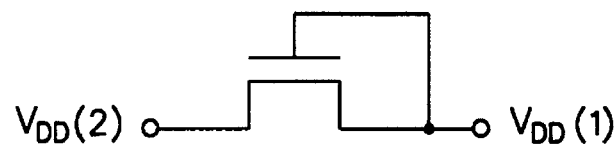
Figure 3:
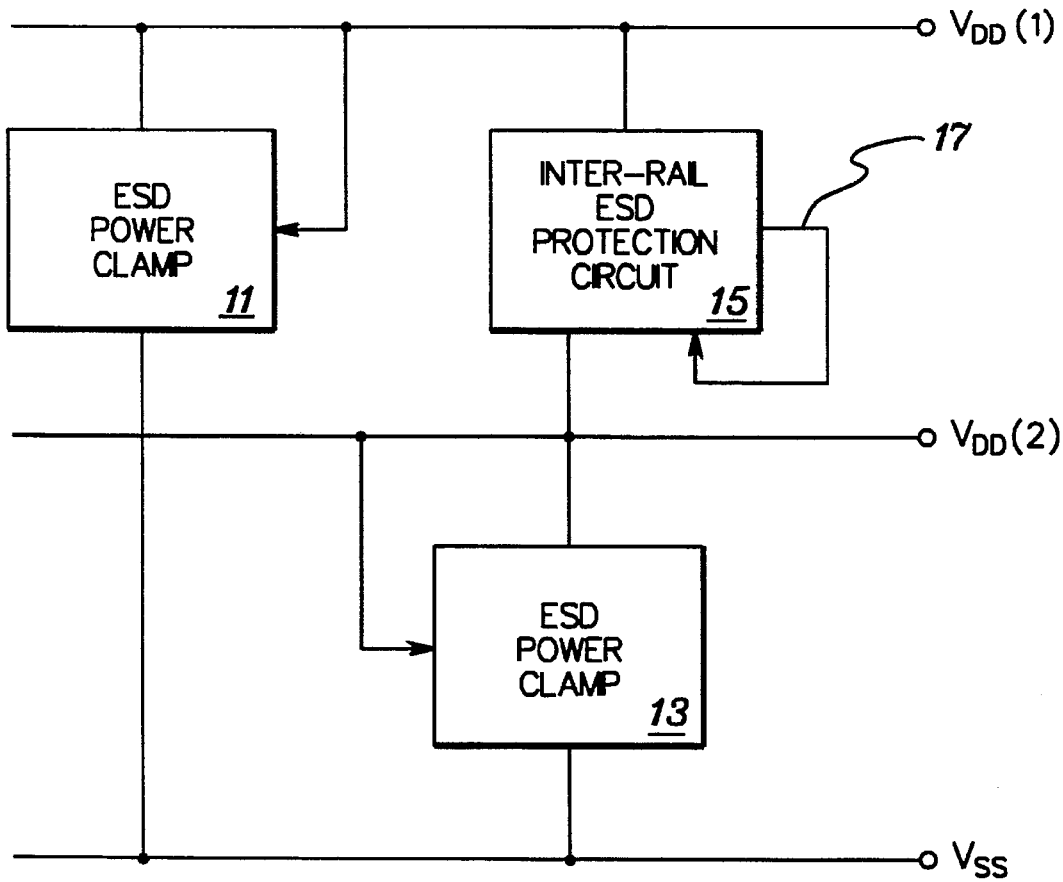
FIG. 3 is a block diagram of a power sequence independent ESD protection circuit pursuant to a first embodiment of the present invention.

A block diagram of an ESD protection circuit according to a first embodiment of the present invention is shown in FIG. 3. Two power supply rails, $Vdd_1$ and $Vdd_2$, are shown along with a ground (Vss). Power supply rails $Vdd_1$ and $Vdd_2$ may be, for example, independently externally powered or one of the power supply rails may carry a voltage that is regulated from the other power supply rail through conventional regulator circuitry. In this example, $Vdd_1$ is coupled to ground through an ESD impulse triggered power clamp ("power clamp") 11, and $Vdd_2$ is coupled to ground through an ESD impulse triggered power clamp 13. Each of these power clamps is designed such that an ESD impulse on their respective power rails will activate the corresponding power clamp (11 or 13) which will dissipate the ESD impulse into ground.

An inter-rail ESD protection circuit 15 couples $Vdd_1$ to $Vdd_2$ for discharging ESD impulses therebetween. ESD protection circuit 15 also includes circuitry that facilitates the power sequence independent operation of the present invention. Specifically, a control connection 17 carries a bias voltage that prevents ESD protection circuit 15 from dissipating power supply current from an energized power rail to a de-energized power rail during operational power sequencing as will be described in further detail below.

Figure 4:
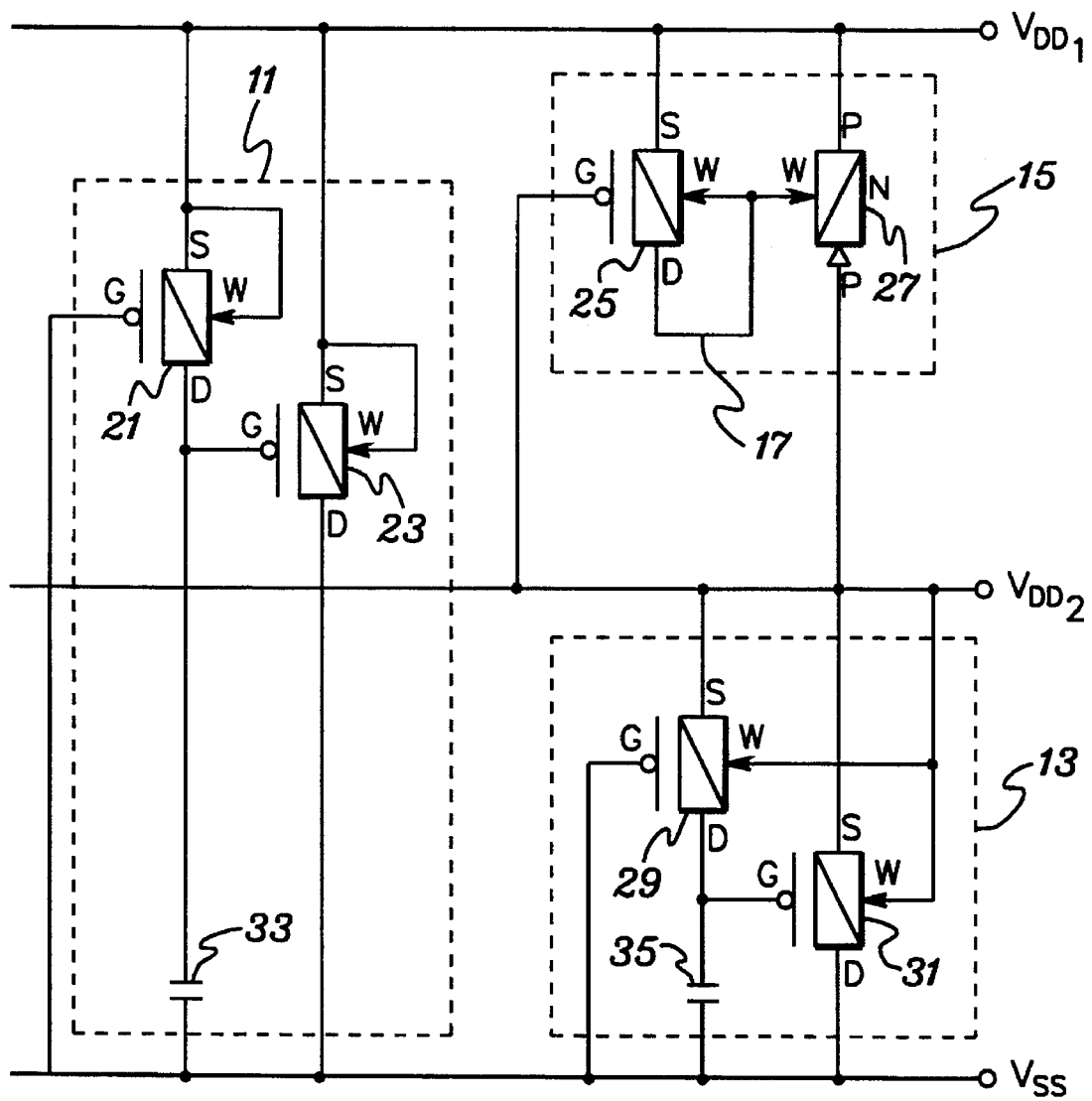
FIG. 4 is a schematic diagram of an example implementation of the ESD protection circuit of FIG. 3.

One example implementation of the inter-rail ESD circuit 15 of FIG. 3 is shown in the schematic diagram of FIG. 4. Inter-rail ESD protection circuit 15 includes a PNP transistor 27 having its current carrying terminals connected between $Vdd_1$ and $Vdd_2$ and functioning as the ESD conduction device therebetween. Also included is a P-channel MOSFET ("PFET") 25 that functions as a biasing device for transistor 27 to provide the power sequence independence of the present invention. Specifically, the drain ("D") and well ("W") of PFET 25 are connected to the well ("W") of transistor 27. The source ("S") of PFET 25 is connected to $Vdd_1$ and the gate of PFET 25 is connected to $Vdd_2$.

During an ESD impulse on, for example, $Vdd_1$ when $Vdd_2$ is at ground potential, the N-well of transistor 27 floats up with the ESD impulse, the transistor forward biases and the ESD impulse is dissipated into $Vdd_2$. As transistor 27 is symmetrical, an ESD impulse on $Vdd_2$, when $Vdd_1$ is at ground potential, functions according to the same mechanism as the $Vdd_1$ to $Vdd_2$ ESD impulse discussed above. The bias connection from PFET 25 has little effect on this mechanism because PFET 25 is sized much smaller than transistor 27. For example, transistor 27 may have a width of approximately 400–1000 microns with a base width of approximately 0.71.–1.1 microns, while PFET 25 may have a width of approximately 100 microns and a channel length of approximately 0.5–0.7 microns.

During circuit operations, it is important at each stage of power sequencing that power supply current does not flow from an energized power rail to an de-energized power rail through inter-rail ESD suppression circuit 15. The power sequence independence of inter-rail ESD suppression circuit 15 is facilitated by the bias provided by the drain/well of PFET 25 that is connected to the well (N-well) of transistor 27.

An example of the power sequence independence of ESD suppression circuit 15 is discussed in the following example which begins with a power-on sequence. Beginning with $Vdd_1$ and $Vdd_2$ at ground potential, $Vdd_1$ is raised to 2.5 v. PFET 25 turns on, thereby raising the N-well of transistor 27 and the N-well of PFET 25 (structurally the same N-well— e.g., FIG. 9) to 2.5 v. Transistor 27 is thus reverse biased and no current flows therethrough. As power sequencing continues, $Vdd_2$ is raised to 3.3 v. During this transition, PFET 25 turns off, however, the common N-well remains charged at 2.5 v and charges up to 3.3 v−$V_{BE}$ as $Vdd_2$ is raised ($V_{BE}$ is the voltage drop from the well of transistor 27 to its emitter which is connected to $Vdd_2$). More specifically, $V_{BE}$ is equal to a single 0.7 v diode drop such that the N-well charges to approximately 2.6 v. Transistor 27 remains reverse biased such that no current flows through it and between the power rails.

As a further power sequence beginning with both power rails energized, a power saving mode could require that, e.g., $Vdd_1$ is lowered to ground potential while $Vdd_2$ is maintained at 3.3 v. During, and after, this transition, PFET 25 remains off and the common N-well remains charged at 2.6 v with transistor 27 being reverse-biased as discussed hereinabove. Thus, no current flows between $Vdd_1$ and $Vdd_2$ thereby satisfying the power sequence independence of inter-rail ESD protection circuit 15.

Each of the power rails ($Vdd_1$ and $Vdd_2$) are connected to ground ($V_{SS}$) via a dedicated ESD impulse triggered power clamp ("power clamp") for the discharge of ESD impulses into ground. These circuits are designed to dissipate an ESD impulse into ground, and to avoid coupling their respective power rail to ground upon power-up thereof.

Power clamp 11 contains two PFETs, PFET 21 and PFET 23. PFET 21 is part of an ESD sense circuit that controls the activation of PFET 23 which comprises a controllable discharge circuit. Each of PFETs 21 and 23 has its source ("S") and well ("W") commonly connected and tied to $Vdd_1$. A gate ("G") of PFET 21 is connected to ground ($V_{SS}$) such that PFET 21 is normally conducting when $Vdd_1$ is energized. The drain of PFET 21 is capacitively coupled to ground through capacitor 33 forming a low-pass filter. Thus, little current will flow through capacitor 33 unless $Vdd_1$ is subject to an impulse of lower frequency than that which corresponds to the time constant of the circuit including capacitor 33 and PFET 21. PFET 23 has its drain connected to ground and its gate connected to the drain of PFET 21.

Upon an ESD impulse on $Vdd_1$ (i.e., high frequency energy), capacitor 33 is unable to charge fast enough to pass the ESD impulse through it to ground and the drain of PFET 21 will remain at approximately ground along with the gate of PFET 23 due to the connection therebetween. Simultaneously, the source of PFET 23 is presented with the ESD impulse, and when the voltage difference between the gate and the source ($V_{GS}$) of PFET 23 exceeds its threshold voltage ($V_T$), PFET 23 will conduct and dissipate the ESD impulse into ground.

The peak power duration of an ESD impulse is typically on the order of $10^{-8}$ to $10^{-7}$ seconds. Thus, the value capacitor 33 is designed to filter out signals of the frequency of ESD impulses. However, capacitor 33 should be sized such that signals of frequencies corresponding to power-on sequences (on the order of $10^{-6}$ seconds) charge the capacitor such that PFET 23 is not saturated during power on, detrimentally causing a short circuit of $Vdd_1$ to ground. Particularly, during power-on, capacitor 33 charges, thereby raising the voltage of the drain of PFET 21, the gate of PFET 23 and the source of PFET 23. Accordingly, $V_T$ of PFET 23 is never exceeded and PFET 23 remains off during power-on. Power sequence independence is therefore provided by ESD impulse triggered power clamp circuit 11.

Selection of a value for the capacitor 33 will be apparent to one of ordinary skill in the art in view of the above discussion. For example, a capacitance of approximately 5 picofarads corresponds to a time constant of $10^{-8}$ seconds. Furthermore, capacitor 33 (and capacitor 35 discussed below) may be selected from one of the conventional IC type capacitors (e.g., trench or stacked) or may comprise a semiconductor junction device with inherent capacitance such as a forward biased PN junction.

ESD impulse triggered power clamp circuit 13 functions similarly to ESD impulse triggered power clamp 11. A PFET 29 and capacitor 35 comprise an ESD sense circuit, while a PFET 31 comprises a controllable discharge circuit. PFET 29 has its source connected to $Vdd_2$, its gate coupled directly to ground and its drain coupled to ground through capacitor 35. PFET 31 has its source connected to $Vdd_2$ and its drain connected to ground. The drain of PFET 29 is connected to the gate of PFET 31 for control thereof. The wells of PFETs 29 and 31 are connected to $Vdd_2$.

As in power clamp circuit 11, upon the occurrence of an ESD impulse on $Vdd_2$, capacitor 35 can not charge fast enough and the drain of PFET 29 and gate of PFET 31 remain at ground ($V_{SS}$). The source of PFET 31 tracks the ESD impulse, and when $V_{GS}$ of PFET 31 exceed its $V_T$, PFET 31 turns on thereby dissipating the ESD impulse into ground.

In further embodiments of the present invention, inter-rail ESD suppression circuit 15 is useful in improving the ESD dissipation characteristics of ESD impulse triggered power clamping circuits 11 and 13. The common N-well of PFET 25 and transistor 27 may be shared with the two PFETs of either ESD clamping circuit.

Figure 5:
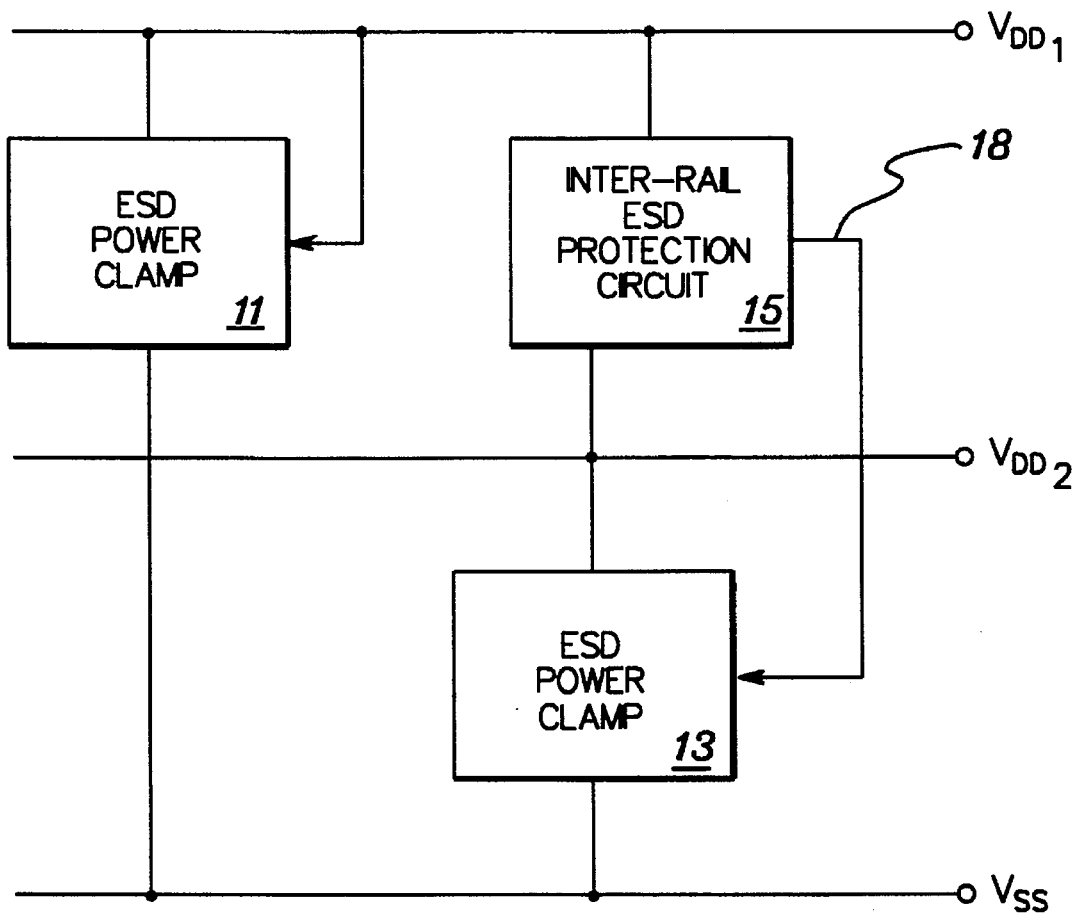
FIG. 5 is a block diagram of a sequence independent ESD protection circuit according to a second embodiment of the present invention.
Figure 6:
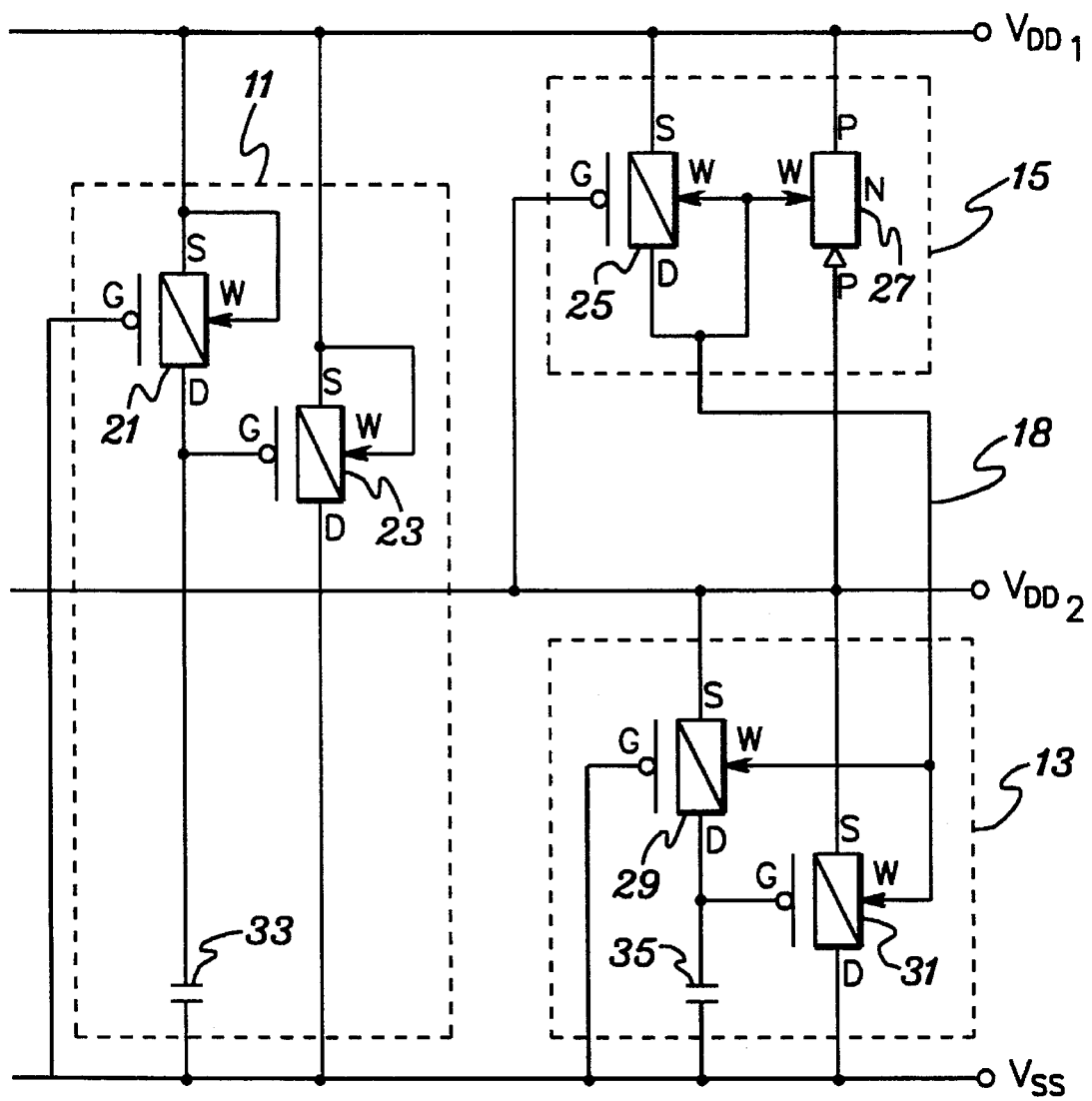
FIG. 6 is a schematic diagram of an example implementation of the ESD protection circuit of FIG. 5.

In a first example shown in FIG. 5, a control connection 18 (e.g., in the form of a shared N-well) for facilitating power sequence independence is established between inter-rail ESD protection circuit 15 and ESD impulse triggered power clamping circuit 13. More specifically, as shown in the schematic diagram of FIG. 6, the N-wells of transistor 27 and PFET 25 are connected to (i.e., structurally shared with) the N-wells of PFETs 29 and 31. During an ESD impulse, the ESD suppression mechanism of power clamping circuit 11 functions similarly to the implementation of, e.g., FIG. 4, when it did not have the shared N-well with inter-rail ESD suppression circuit 15. However, ESD dissipation is enhanced by the circuit of FIG. 6. Specifically, because the N-well of PFET 31 is shared with the N-well of transistor 27, a parallel path from $Vdd_2$ to the shared N-well exists through both PFET 31 and transistor 27. Once the ESD impulse reaches the shared N-well it may be dissipated through power clamping circuit 13 and through inter-rail ESD protection circuit 15 to $Vdd_1$ and then through power clamping circuit 11 to ground. This shared path enhances ESD current flow, thereby improving ESD performance. Moreover, the power sequence independence of power clamping circuit 13 is not effected by the sharing of N-wells with the devices of inter-rail ESD protection circuit 15.

Figure 7:
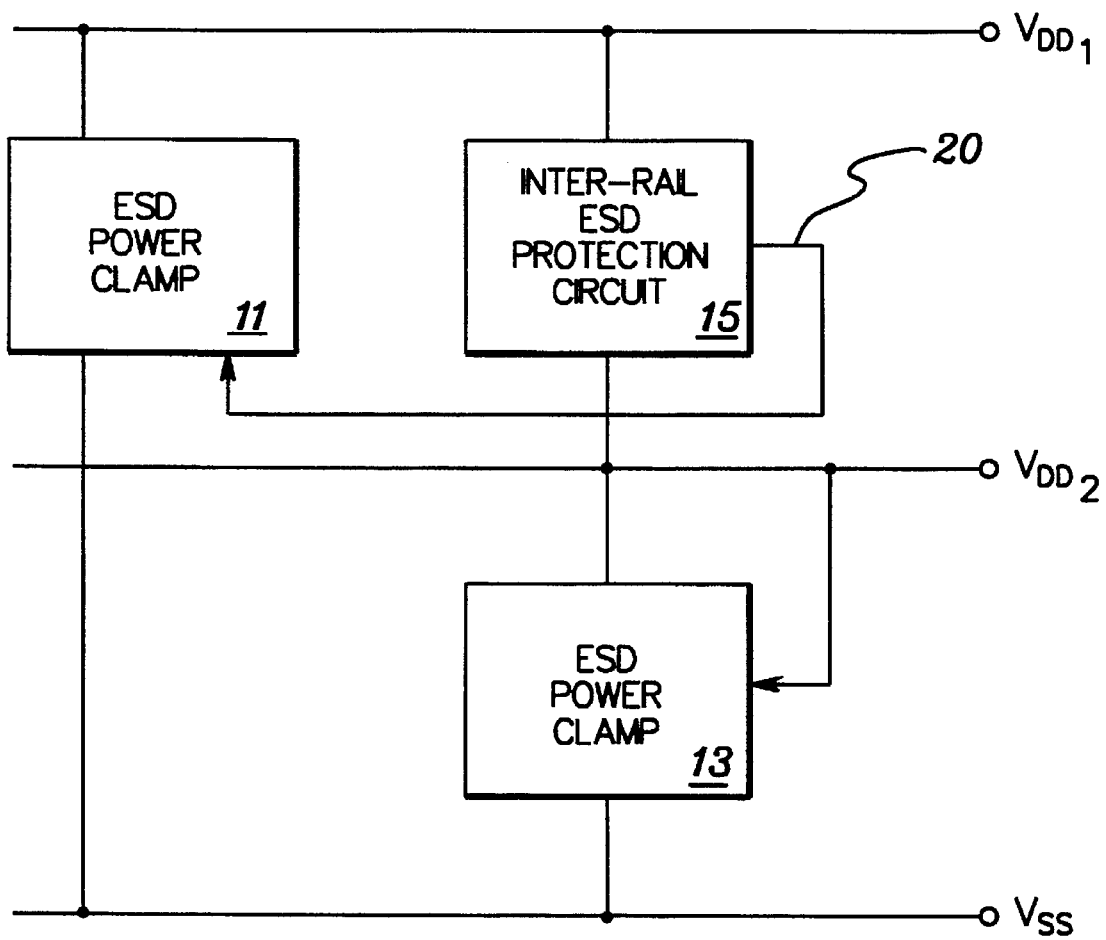
FIG. 7 is a block diagram of a sequence independent ESD protection circuit in accordance with a third embodiment of the present invention.
Figure 8:
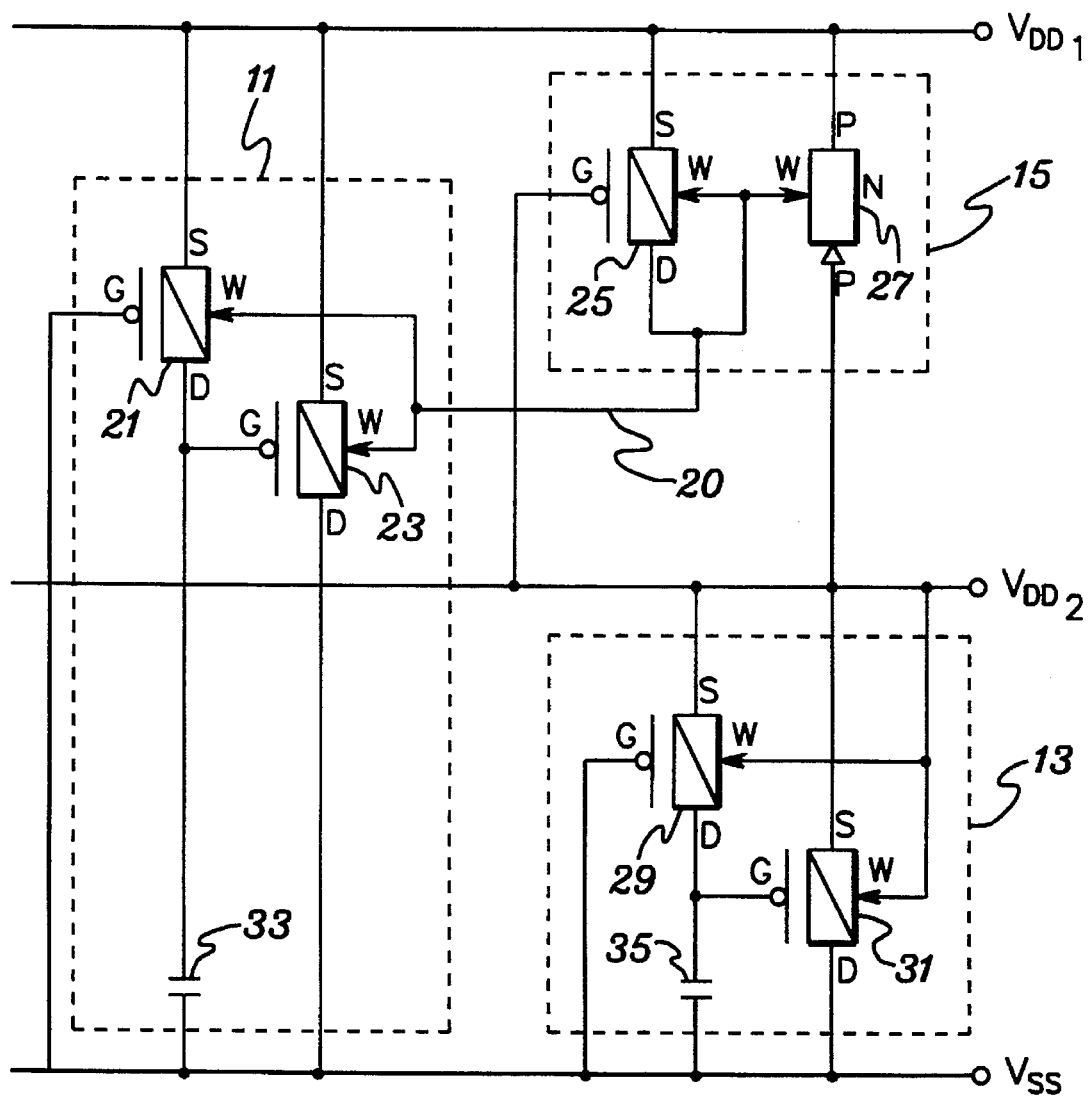
FIG. 8 is a schematic diagram of an example implementation of the ESD protection circuit of FIG. 7.

As a further variation of the techniques disclosed herein that is shown in FIG. 7, a control connection 20 is established (in the form of a shared N-well) between inter-rail ESD protection circuit 15 and ESD impulse triggered power clamping circuit 11. More specifically, as shown in the schematic diagram of FIG. 8, the N-wells of transistor 27 and PFET 25 are connected to (i.e., structurally shared with) the N-wells of PFETs 21 and 23. During an ESD impulse, the ESD suppression mechanism of clamping circuit 11 functions similarly to the embodiment of, e.g., FIG. 4, when it did not have the shared N-well. However, in the current embodiment, ESD dissipation is enhanced. Specifically, because the N-well of PFET 23 is shared with the N-well of transistor 27, a parallel path from $Vdd_1$ to the shared N-well exists through both PFET 23 and transistor 27. Once the ESD impulse reaches the shared N-well it may be dissipated through power clamping circuit 11 and through the series combination of inter-rail ESD protection circuit 15 and power clamping circuit 13. This shared path enhances ESD current flow, thereby improving ESD performance. Moreover, the power sequence independence of power clamping circuit 11 is not effected by the sharing of N-wells with inter-rail ESD protection circuit 15.

Figure 9:
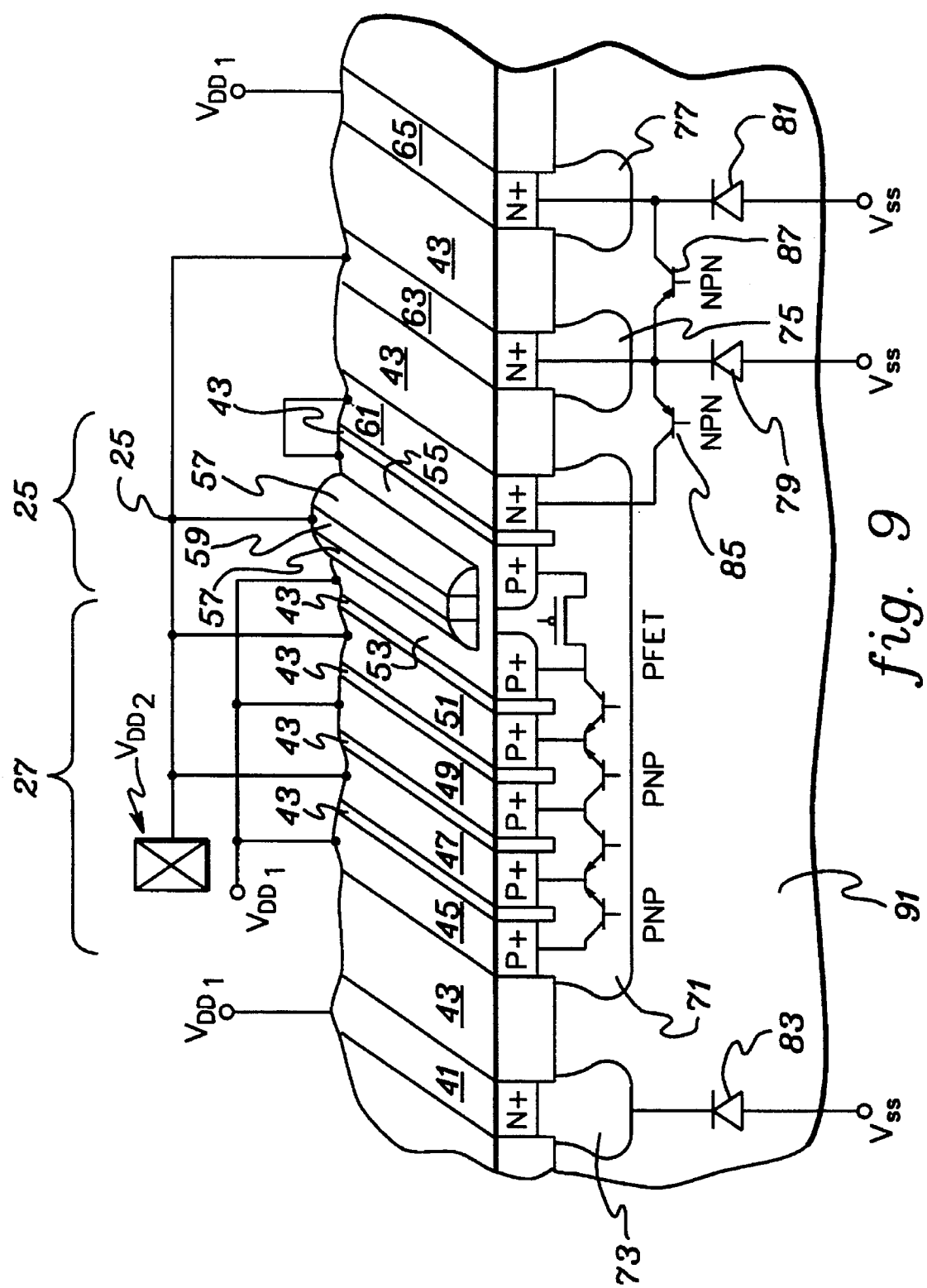
FIG. 9 is a structural diagram of a power sequence independent inter-rail ESD protection circuit pursuant to an embodiment of the present invention.

The structure of the inter-rail ESD protection circuit 15 on an IC chip is shown in FIG. 9. Transistor 27 is implemented as a series of PN junctions comprising P+ diffusions 45, 47, 49, 51 and 53 alternately connected to $Vdd_1$ and $Vdd_2$. Each of the P+ diffusions (45, 47, 49, 51 and 53) abut a common N-well 71. This N-well is shared with PFET 25 which comprises P+ diffusions 53 and 55 and gate stack 59 (including insulators 57). The source 53 of the PFET is connected to $Vdd_1$, while the drain is wired to an N+ diffusion 61 such that it is coupled to the N-well 71. Gate 59 is connected to $Vdd_1$. Insulators 43 separate the diffusion regions.

Additional structure is shown in FIG. 9 that provides suppression of negative ESD impulses from each power rail to ground and between the power rails. In regard to $Vdd_1$ ESD dissipation, the combination of N+ diffusions 41 and 65 with N-wells 73 and 77, respectively, form diodes (83 and 81) to the substrate ground (i.e., $V_{SS}$). In regard to $Vdd_2$ ESD dissipation, the combination of N+diffusion 63 with N-well 75 forms a diode 79 to the substrate ground (i.e., $V_{SS}$). The diodes from the respective power rails to ground dissipate negative ESD impulses on each power rail. An NPN transistor 87, formed by the combination of N-wells 75 and 77 and the P substrate 91, dissipates negative ESD impulses between the power rails $Vdd_1$ and $Vdd_2$. An NPN transistor 85, formed by N-wells 73 and 75 and the P substrate 91, dissipates to N-well 71.

The present invention has many advantages and features associated with it. Power sequence dependent ESD impulse protection is provided between each power rail and ground and between the power rails themselves. The ESD protection circuitry is power sequence independent, thereby eliminating any operational limitations on the sequencing of power supplies for, e.g., power-up and power saving modes. Further, the techniques disclosed herein increase the performance of ESD impulse protection circuits. Higher voltage ESD impulses can therefore be safely discharged. Accordingly, the techniques disclosed herein advance the art of ESD protection of power rails on IC chips.

While the invention has been described in detail herein, in accordance with certain preferred embodiments thereof, many modifications and changes thereto may be affected by those skilled in the art. Accordingly, it is intended by the appended claims to cover all such modifications and changes as fall within the true spirit and scope of the invention.

What is claimed is:

1. A semiconductor structure for protection against an ESD ("Electrostatic Discharge") impulse in a multiple power supply environment having a first power rail, a second power rail, and a ground, said semiconductor structure comprising an inter-rail ESD protection circuit connected between said first power rail and said second power rail, said inter-rail ESD protection circuit being power sequence independent such that said inter-rail ESD protection circuit prevents power supply current flow between said first power rail and said second power rail, through said inter-rail ESD protection circuit, regardless of power sequencing of said first power rail and said second power rail.

2. The semiconductor structure of claim 1, wherein said inter-rail ESD protection circuit includes a first FET having a source, a drain, a gate and a well, said source being connected to said first power rail, said gate being connected to said second power rail, and said drain and said well being commonly connected to facilitate said inter-rail ESD protection circuit being power sequence independent.

3. The semiconductor structure of claim 1, wherein said first power rail comprises a first operational voltage and said second power rail comprises a second operational voltage, said first operational voltage being greater than said second operational voltage.

4. The semiconductor structure of claim 1, further comprising:

a power clamp ESD protection circuit between said first power rail and said ground.

5. The semiconductor structure of claim 4, wherein said power clamp ESD protection circuit includes a controllable discharge circuit and an ESD sense circuit, both connected between said first power rail and said ground, said controllable discharge circuit having a control input connected to said ESD sense circuit, said ESD sense circuit facilitating activation of said controllable discharge circuit when an ESD impulse is detected on said first power rail and facilitating blocking activation of said controllable discharge circuit during power-up of said first power rail.

6. The semiconductor structure of claim 5, further comprising a control connection between said inter-rail ESD protection circuit and each of said controllable discharge circuit and said ESD sense circuit of said power clamp ESD protection circuit for biasing thereof to enhance ESD dissipation of said power clamp ESD protection circuit.

7. The semiconductor structure of claim 6, wherein said controllable discharge circuit comprises a second FET having current carrying terminals, a gate and a well, said current carrying terminals being connected between said first power rail and said ground, said gate being connected to said first ESD sense circuit through said control input for receiving an activation signal therefrom and said well being connected to said control connection.

8. The semiconductor structure of claim 6, wherein said ESD sense circuit comprises a third FET having a first current carrying terminal, a second current carrying terminal, a gate and a well, said first current carrying terminal being connected to said first power rail, said second current carrying terminal being capacitively coupled to said ground and directly coupled to said control input of said controllable discharge circuit, said gate being coupled to said ground, and said well being connected to said control connection, wherein said capacitive coupling facilitates said activation of said controllable discharge circuit in response to high-frequency signals comprising ESD impulses on said first power rail and blocking activation of said controllable discharge circuit during power-up of said first power rail.

9. The semiconductor structure of claim 8, wherein said capacitive coupling of said power clamp ESD protection circuit includes one of a capacitor and a semiconductor junction.

10. The semiconductor structure of claim 6, wherein said power clamp ESD protection circuit comprises a first power clamp ESD protection circuit, and wherein said semiconductor structure further comprises a second power clamp ESD protection circuit connected between said second power rail and said ground.

11. The semiconductor structure of claim 10, wherein said controllable discharge device comprises a first controllable discharge device, said ESD sense circuit comprises a first ESD sense circuit, and wherein said second power clamp ESD protection circuit includes a second controllable discharge circuit and a second ESD sense circuit, both connected between said second power rail and said ground, said second controllable discharge circuit having a control input connected to said second ESD sense circuit, said second ESD sense circuit facilitating activation of said second controllable discharge circuit when an ESD impulse is detected on said second power rail and facilitating blocking activation of said second controllable discharge circuit during power-up of said second power rail.

12. The semiconductor structure of claim 11, wherein said second controllable discharge circuit comprises a fourth FET having current carrying terminals and a gate, said current carrying terminals being connected between said second power rail and said ground, and said gate being connected to said second ESD sense circuit for receiving an activation signal therefrom.

13. The semiconductor structure of claim 11, wherein said second ESD sense circuit comprises a fitch FET including a first current carrying terminal, a second current carrying terminal, a gate and a well, said first current carrying terminal being connected to said second power rail, said second current carrying terminal being capacitively coupled to said ground and directly coupled to said gate of said second controllable discharge circuit, and said gate of said fifth FET being coupled to said ground, wherein said capacitive coupling facilitates said activation of said second controllable discharge circuit in response to high-frequency signals comprising ESD impulses on said second power rail and facilitates blocking activation of said second controllable discharge circuit during power-up of said second power rail.

14. The semiconductor structure of claim 13, wherein said capacitive coupling of said second ESD sense circuit includes one of a capacitor and a semiconductor junction.

15. A semiconductor structure for protection against an ESD ("Electrostatic Discharge") impulse in a multiple power supply environment having a first power rail and a second power rail, said semiconductor structure comprising an inter-rail ESD protection circuit connected between said first power rail and said second power rail, said inter-rail ESD protection circuit being power sequence independent such that said inter-rail ESD protection circuit prevents power supply current flow between said first power rail and said second power rail, through said inter-rail ESD protection circuit, regardless of power sequencing of said first power rail and said second power rail, wherein said inter-rail ESD protection circuit includes a first FET having a source, a drain, a gate and a well, said source being connected to said first power rail, said gate being connected to said second power rail, and said drain and said well being commonly connected to facilitate said inter-rail ESD protection circuit being power sequence independent, and wherein said inter-rail ESD protection circuit further comprises a transistor having a well, a first current carrying terminal and a second current carrying terminal, said well being connected to said commonly connected drain and well of said first FET, said first current carrying terminal being connected to said first power rail and said second current carrying terminal being connected to said second power rail for discharging an ESD impulse between said first power rail and said second power rail and for facilitating said inter-rail ESD protection circuit being power sequence independent.

\* \* \* \* \*

UNITED STATES PATENT AND TRADEMARK OFFICE
CERTIFICATE OF CORRECTION

PATENT NO. : 5,610,791
DATED : Mar. 11, 1997
INVENTOR(S) : Steven H. Voldman

It is certified that error appears in the above-identified patent and that said Letters Patent are hereby corrected as shown below:

Column 9, line 33, claim 13          "fitch" should be --fifth--.

Signed and Sealed this

Twenty-third Day of September, 1997

Attest:

BRUCE LEHMAN

Attesting Officer          Commissioner of Patents and Trademarks